US009812941B2

(12) United States Patent
Sicard et al.

(10) Patent No.: US 9,812,941 B2
(45) Date of Patent: Nov. 7, 2017

(54) HIGH POWER DRIVER HAVING MULTIPLE TURN OFF MODES

(71) Applicant: FREESCALE SEMICONDUCTOR, INC., Austin, TX (US)

(72) Inventors: Thierry Michel Alain Sicard, Austin, TX (US); Ibrahim Shihadeh Kandah, Austin, TX (US); Philippe Jean Pierre Perruchoud, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/193,559

(22) Filed: Jun. 27, 2016

(65) Prior Publication Data
US 2017/0077805 A1    Mar. 16, 2017

(30) Foreign Application Priority Data

Sep. 11, 2015  (WO) .................. PCT/IB2015/001892

(51) Int. Cl.
*H02M 1/08* (2006.01)
*H02M 1/32* (2007.01)
*H03K 17/082* (2006.01)

(52) U.S. Cl.
CPC .............. *H02M 1/08* (2013.01); *H02M 1/32* (2013.01); *H03K 17/0828* (2013.01)

(58) Field of Classification Search
CPC ........... H02M 2001/0009; H02M 1/08; H02M 1/083; H02M 3/156; H02M 2003/1566
See application file for complete search history.

(56) References Cited

U.S. PATENT DOCUMENTS

| 4,371,824 | A  | * | 2/1983  | Gritter ................ B60L 11/1803 318/681 |
| 7,570,101 | B1 | * | 8/2009  | Short ................... H03K 17/168 327/432 |
| 8,723,591 | B2 |   | 5/2014  | Lee et al. |
| 2002/0135345 | A1 | * | 9/2002  | Terashi ................ H02M 3/156 323/283 |
| 2008/0239773 | A1 | * | 10/2008 | Yang ................. H02M 3/33592 363/127 |
| 2009/0066402 | A1 | * | 3/2009  | Hiyama ............... H03K 17/168 327/392 |
| 2010/0231190 | A1 | * | 9/2010  | Falvey .................. H02M 3/158 323/284 |
| 2011/0273206 | A1 | * | 11/2011 | Lee ......................... H02M 1/08 327/109 |

(Continued)

FOREIGN PATENT DOCUMENTS

CN    202888814    4/2013

*Primary Examiner* — Jeffrey Gblende
*Assistant Examiner* — David A. Singh

(57) ABSTRACT

A transistor circuit includes a transistor having a control electrode, a first current electrode, and a second current electrode. A turn off mode change circuit has a signal input that receives a series of pulses, an output coupled to the control electrode of the transistor, and a control input. The turn off mode change circuit has a fast turn off mode and a slow turn off mode. A turn off mode detection circuit is coupled between the first current electrode and the second current electrode. The turn off mode change circuit detects when a transition from the fast turn off mode to the slow turn off mode is desired and when a transition from the slow turn off mode to the fast transition mode may be performed.

19 Claims, 5 Drawing Sheets

(56) References Cited

U.S. PATENT DOCUMENTS

| | | | |
|---|---|---|---|
| 2013/0021067 A1* | 1/2013 | Lee | H03K 17/168 |
| | | | 327/109 |
| 2013/0082741 A1* | 4/2013 | Domes | H03K 17/13 |
| | | | 327/79 |
| 2014/0070784 A1* | 3/2014 | Lynch | G05F 1/46 |
| | | | 323/283 |
| 2014/0320178 A1* | 10/2014 | Hosini | H03K 17/08128 |
| | | | 327/109 |
| 2014/0321178 A1 | 10/2014 | Cyr et al. | |
| 2015/0043252 A1* | 2/2015 | Kuang | H02M 3/33507 |
| | | | 363/21.16 |
| 2015/0349630 A1* | 12/2015 | Peng | H02M 3/156 |
| | | | 323/282 |

* cited by examiner

HIGH POWER DRIVER HAVING MULTIPLE TURN OFF MODES

This application claims the priority under 35 U.S.C. § 119 of Patent Cooperation Treaty application no. IB2015/001892, filed on 11 Sep. 2015, the contents of which are incorporated by reference herein.

BACKGROUND

Field

This disclosure relates generally to drivers, and more particularly, to high power drivers.

Related Art

High power driver applications, including drivers for motors, continue to be significant and potentially increasingly significant in motors for cars. The ability to optimize performance is becoming thus even more critical. In applying power, both the current and the voltage may increase to a point where the circuitry providing the output to the receiving device, which may be a motor, can be subject to very high power. To provide control and power, the semiconductor device providing the output can simultaneously have a both a high voltage across it and be providing a high current. The power being dissipated is the product of the current times voltage which can become excessive. A large current can require very manageable power dissipation if the voltage across the semiconductor device is not too large. There are modes, however, where both the current and voltage can be high.

Accordingly there is a need to provide further improvement in attaining control over power dissipation in cases where both the current through and the voltage across the output device might naturally be high under some circumstances.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a high power driver that provides current to a load. The current can be either in a first direction or a second direction. The high power driver has an output driver and a detection circuit that, when the voltage across the output driver reaches a predetermined level, clamps the voltage across the output driver. This has the effect of, if not immediately, ultimately reducing the output current. At a point considered to be safe, the clamping is withdrawn and normal operation of the high power driver may continue. An effective way to switch from the clamping action back to the normal operation is to perform this change when the current reaches the point where it will change its direction through the load. This is better understood by reference to the drawings and the following written description.

Figure 1:
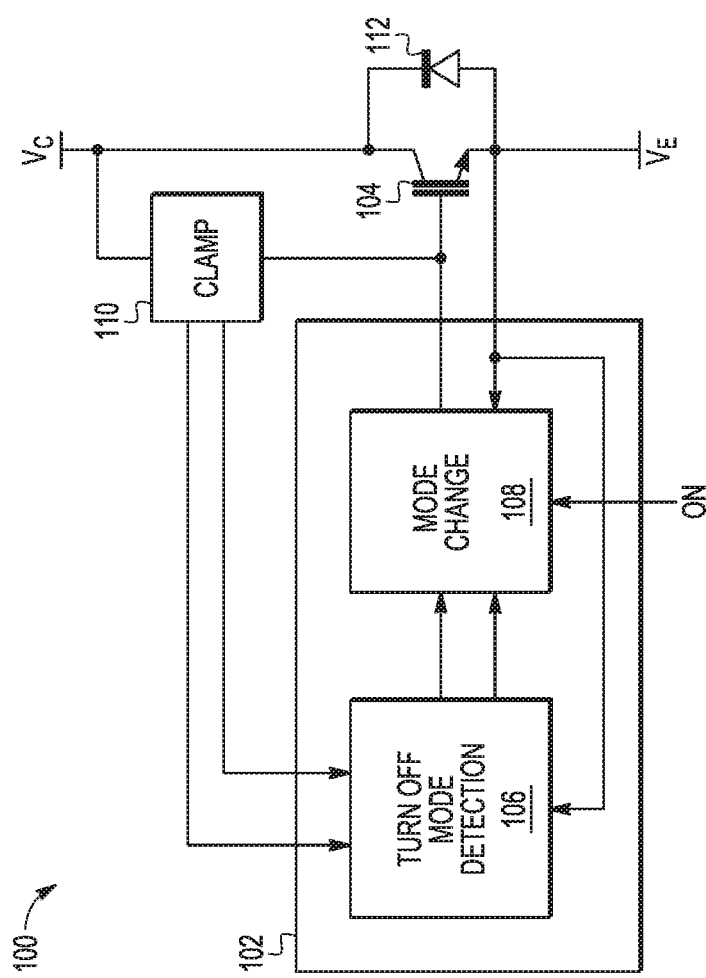
FIG. 1 is a combination block diagram and circuit diagram of a high power driver.

Shown in FIG. 1 is a high power driver 100 that includes a device driver circuit 102 and an insulated gate bipolar transistor (IGBT) 104, and a clamp 110. IGBT 104 has a collector connected to a voltage terminal VC, and emitter connected to a voltage terminal VE, and a gate connected to an output of device driver circuit 102. Device driver circuit 102 includes a turn off mode detection (TOMD) 106 and a mode change circuit 108. TOMD 106 has an input coupled to voltage terminal, a first mode output coupled to a first mode input of mode change circuit 108, a second mode output coupled to a second mode input of mode change circuit, a first clamp output coupled to a first input of clamp 110, and a second clamp output coupled to a second clamp input of clamp 110. Mode change circuit 108 also receives and enable signal ON which functions as a pulse width modulation (PWM) signal. Clamp 110 has a first clamping terminal coupled to voltage terminal VC and a second clamping terminal coupled to the gate of IGBT 104. High power driver 100 may have a load connected to one of voltage terminal VC or voltage terminal VE. In the case of a three phase motor being the device being driven, a known technique is to have a six drivers, a pair for each phase. One driver of the pair would have its emitter coupled to the phase and the other driver of the pair would have its collector coupled to the phase. In a push pull fashion, the current flows from collector to emitter in both the case of the IGBT having its collector coupled to terminal VC having its emitter coupled to terminal VC. In a PWM type operation, enable signal ON operates at a fixed frequency but with a varying duty cycle, PWM, in which a greater variation in duty cycle is for higher power.

In operation, TOMD 106, while IGBT 104 is operating normally in providing current from its collector to its emitter, is detecting if the voltage, voltage VCE, between terminals VC and VE reaches a predetermined magnitude indicating voltage VCE is about to become destructive. The amount of current expected to be flowing may be a factor in determining the predetermined magnitude or it may be a breakdown voltage. When TOMD 106 detects that the predetermined voltage has been reached, TOMD 106 signals this to mode change circuit 108 and to clamp 110. Mode change circuit 108 responds by providing an appropriate output to IGBT 104, and clamp 110 responds by clamping the gate to collector voltage. An effective approach to driving IGBT 104 is to use pulse width modulation (PWM). The beginning of each of the pulses typically has an intended overshoot. It this intended overshoot that may be clamped. This clamping effectively reduces the risk of damage to IGFET 104. As this continues, in the case of a push pull arrangement, the current will eventually reverse. It is at this point of reversal that it is convenient and effective to remove the clamping. This point of reversal is sometimes referred to as zero crossing and is detected by TOMD 106. Upon detection, TOMD 106 signals this to mode change circuit 108 which then resumes normal operation.

Figure 2:
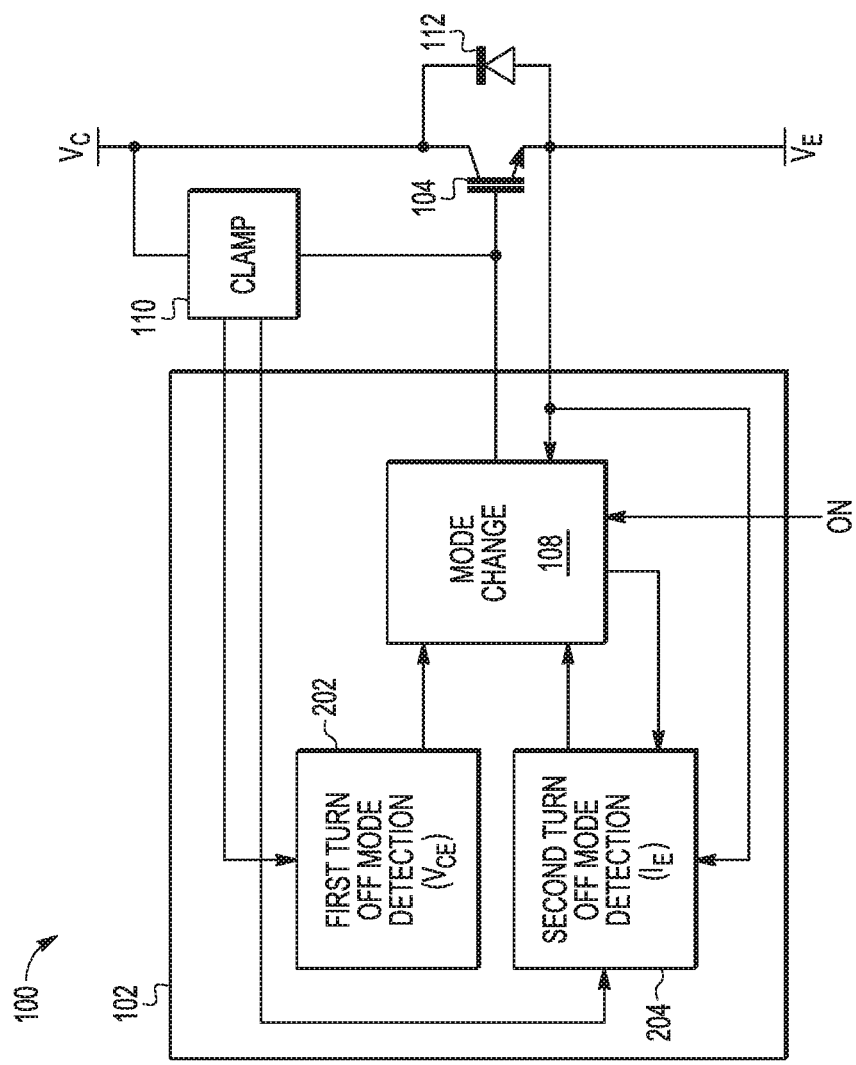
FIG. 2 is a combination block diagram and circuit diagram showing more detail of the high power driver of FIG. 1.

Shown in FIG. 2 is high power driver 100 showing that TOMD 106 may comprise a first TOMD 202 and a second TOMD 204. First TOMD 202 detects the risk of too high of a voltage and responds signaling this to clamp 110 with a first clamping signal at the first clamping input of clamp 110. TOMD 202 detects the dangerous level of operation and indicates to mode change circuit 108 that voltage clamping mode is to be started. Second TOMD 204, having inputs coupled to power supply terminal VC and a second clamping output coupled to the second clamping input of clamp 110 and a second mode signal coupled to mode change circuit 108. Second TOMD 204, detects current reversal and indicates to mode change circuit 108 that normal operation can be resumed.

Figure 3:
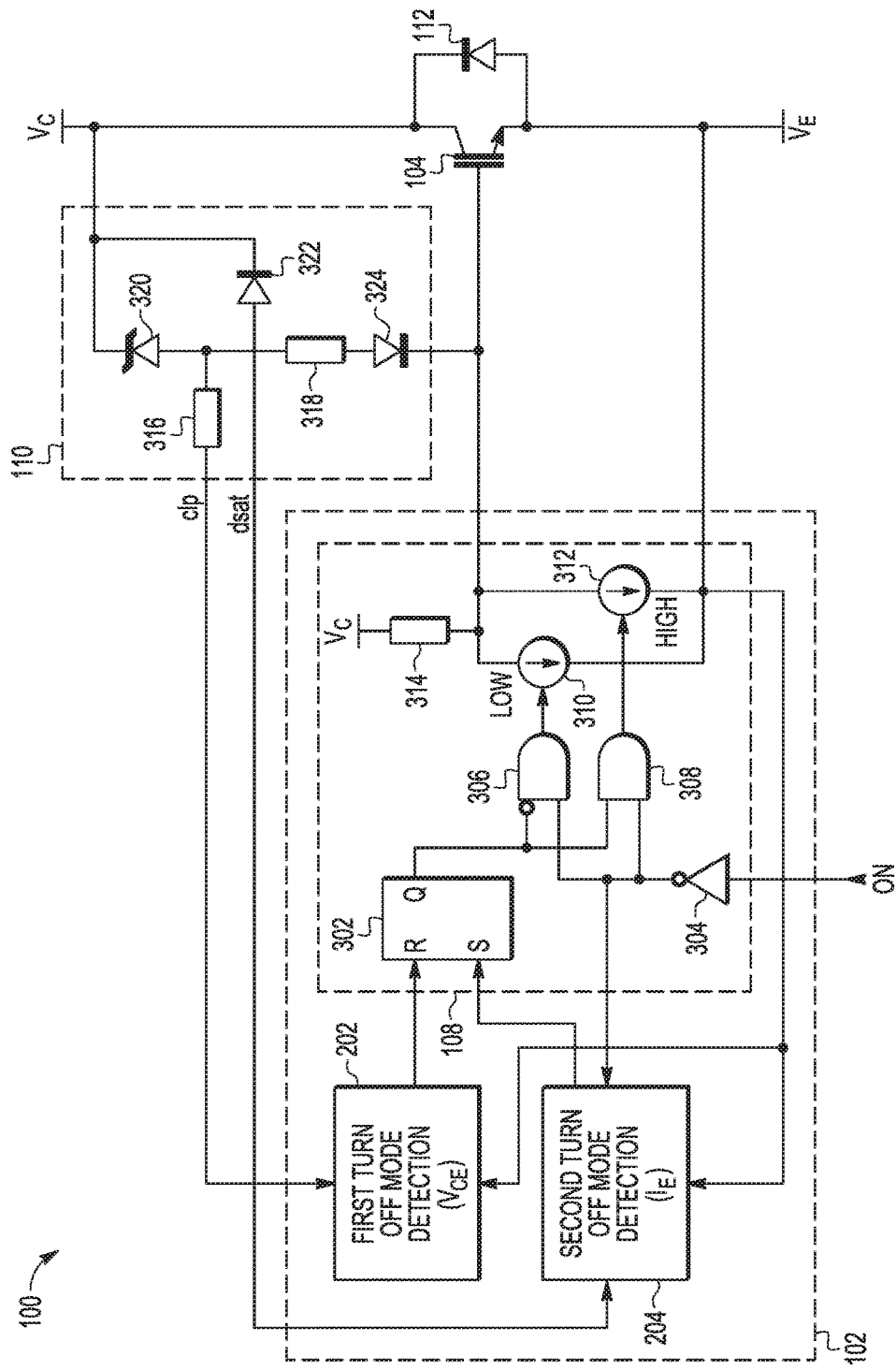
FIG. 3 is a combination block diagram, logic diagram, and circuit diagram showing more detail of the high power driver of FIGS. 1 and 2.

Shown in FIG. 3 is mode change circuit 108 and clamp 110 in more detail. Mode change circuit 108 includes an RS flip-flop 302, an inverter 304, an AND gate 306 with an inverting input, an AND gate 308, a current source 310, a current source 312, and a load 314. Load 314 may be resistive. RS flip-flop 302 has a reset (R) input connected to the output of first TOMD 202, a set (S) input coupled to the output of second TOMD 204, and an output Q. Inverter 304 has an input for receiving an enable signal ON and an output. AND gate 306 has an input connected to the output of inverter 304, the inverting input connected to output Q, and an output. AND gate 308 has a first input connected to the output of inverter 304, a second input coupled to output Q, and an output. Current source 310 has an output connected to the emitter of IGBT 104, a control input connected to the output of AND gate 306, and an input connected to the gate of IGBT 104. Current source 312 has an output connected to the emitter of IGBT 104, a control input connected to the output of AND gate 308, and an input connected to the gate of IGBT 104. Load 314 has a first terminal connected to a power supply power supply terminal Vsp. Voltage Vsp could be the same power supply terminal used in powering AND gates 306 and 308, RS flip-flop 302, first TOMD 202, and second TOMD 204. Second TOMD 204 has an active input connected to the output of inverter 304 to detect if the high power driver is active. Clamp 110 has a load 316, a load 318, a zener diode 320, a diode 322, and a diode 324. Loads 316 and 318 may be resistive. Load 316 has a first terminal as the second clamping input of clamp 110 and a second terminal. Zener diode 320 has an anode coupled to the second terminal of load 316 and a cathode connected to power supply terminal VC. Diode 322 has an anode as the second clamping input of clamp 110 and a cathode connected to power supply terminal VC. Load 318 has as first terminal connected to the anode of zener diode 320 and the anode of diode 322 and a second terminal. Diode 324 has an anode connected to the second terminal of load 318 and a cathode connected to the gate of iGBT 104.

If enable signal ON is a logic high, then mode change circuit 108 is disabled and no current flows through either current source 310 or 312 so the voltage on the gate of IGBT 104 is not reduced by current flowing through either current source 310 or 312. This is the condition in which IGBT 104 is fully enabled and operates uninhibited by mode change circuit 108. Enable signal ON functions at the pulse width modulation (PWM) frequency. If enable signal ON is a logic low, AND gates 306 and 308 have logic highs on their second inputs and thus are responsive to their other input. If output Q is a logic high, the inverting input of AND gate 306 receives a logic high which is inverted so that AND gate 306 provides a logic low output while AND gate 308, which has logic highs on both inputs so that AND gate 308 provides a logic high output. The logic low output of AND gate 306 disables current source 310 while the logic high output of AND gate 308 enables current source 312. Current source 312 provides a higher current than current source 310 and thus a larger current through load 314 and thus a larger voltage drop across load 314. The larger voltage drop across load 314 causes a lower voltage on the gate of IGBT 104 and thus less current through IGBT 104 than when current source 310 is enabled and current source 312 is disabled. For the Q output of RS flip-flop being a logic low, AND gate 308 provides a logic low output disabling current source 312 while AND gate 306 provides a logic high enabling current source 310, which is provides a lower current than current source 312 and thus a lower current through load 314. The lower current through load 314 results in a lower voltage drop through load 314 and thus a higher voltage at the gate of IGBT 104 and higher current through IGBT 104 than for the case where current source 312 is enabled. Thus enable signal ON is a logic high to activate a normal mode which is similar to a common approach and is a logic low to activate a mode in which detection of a risk of excessive power is implemented and, if such detection occurs, a current limitation is activated.

With enable signal ON at a logic low, either current source 310 is active or current source 312 is active. Typically, current source 312, which is the high current source, will be initially active which is implemented by output Q being a logic high. This is achieved with first TOMD 202 providing a logic low to input R and second TOMD 204 providing a logic high to input S. After output Q has been established at a logic high, second TOMD 204 switches input Q to a logic low. Output Q remains at a logic high. Current source 312 is providing the current that is the relatively high current. This is considered the efficient mode because it allows for IGBT 104 to turn off quickly as possible to reduce power losses. The efficient mode, however, can also result in an excessive power situation in which the voltage across IGBT 104 and the current through IGBT 104 are both high. With both the power and the voltage being high, the product of the two, which is the power, can be damaging to IGBT 104.

Figure 4:
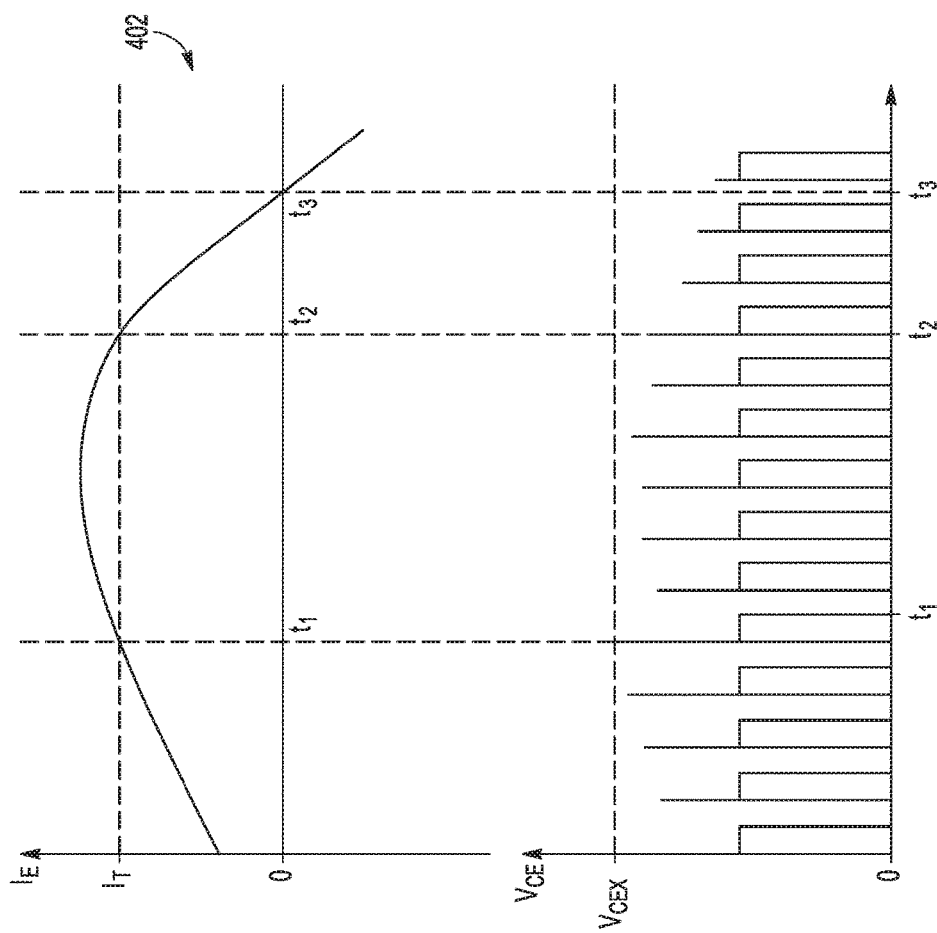
FIG. 4 is a first timing diagram useful in understanding the operation of the high power driver of FIGS. 1, 2, and 3.
Figure 5:
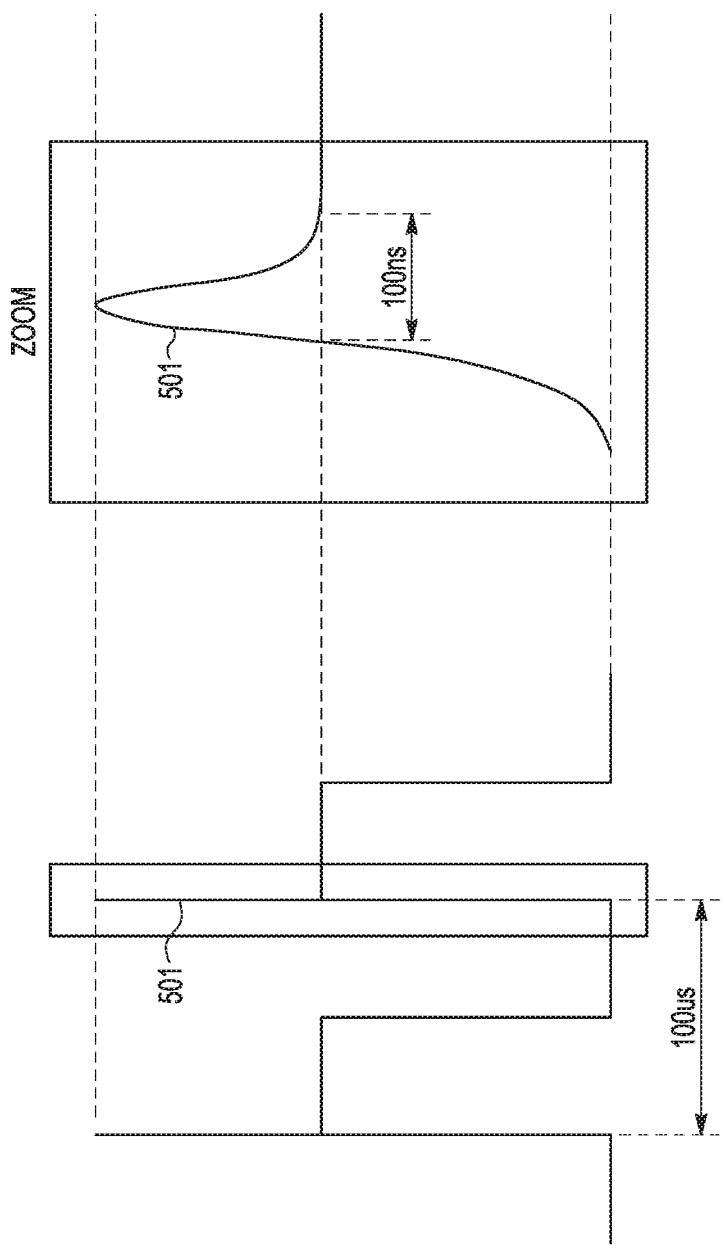
FIG. 5 is a second timing diagram useful in understanding the operation of the high power driver of FIGS. 1, 2, and 3.

This situation is avoided by detecting when the voltage across IGBT 104, voltage VCE, reaches a predetermined level, voltage VCE, which is known, typically by experiment and modeling, to indicate that there is a risk that the current-voltage product will become excessive. Thus, when voltage VCE reaches voltage VCEX, there is a risk of the power becoming excessive. When first TOMD 202 detects that the voltage of signal clp indicates that voltage VE has reached voltage VCEX, first TOMD 202 switches output R to a logic high which causes output Q to switch to a logic low. This causes AND gate 306 to output a logic high to enable current source 310, which is the low current source, and AND gate 308 to output a logic low to disable current source 312. This is shown in FIG. 4 as occurring at a time t1. After output Q is stabilized as a logic low, first TOMD 202 switches input R to a logic low. This does not change output Q. As is common with the use of pulse width modulation (PWM) in driving motors, a pulse has a narrow spike followed by a fixed level for the vast majority of the overall width of the pulse. This is shown in FIG. 5 with a spike 501 at the beginning of a 100 microsecond pulse in which the spike, shown as a zoom, is 100 nanoseconds. In this example, the overall pulse is a thousand times wider than the spike. The peak of the spike of the pulse terminating at time t1 is an excessive voltage level VCEX and with a current IE through IGBT 104 of $I_T$ at time T1. With current source 312 now rapidly reducing the voltage on the gate of IGBT 104, VCE will reach VCEX at a certain output current value shown as IT in FIG. 4. Shown in FIG. 4 is the current through IGBT when the current is above zero and through diode 112 when the current is below zero. Also shown in is voltage VCE across IGBT 104, in simplified form, showing a frequency for pulses of voltage VCE that have a spike at the beginning. The frequency of the pulses is the frequency of enable signal ON. The spike occurs at the transition of enable signal ON to a logic low. Current IE as being smooth is for the case of the load attached to IGBT 104 being inductive, such as the case for a motor.

The point at which a spike of voltage VCE reaches voltage VCEX is where the efficient mode must be changed due to the detection that VCEX has been reached. Clamp 110 functions to detect the presence of the spike that reaches VCEX by providing signal dsat. First TOMD 202 set input R to a logic high so that output Q of flip-flop 302 goes to a logic low which disables current source 312, the high current source, and enables current source 310, the low current source. Thus IGBT 104 is being driven with a lower current after time 1 and is in the safe mode until current IT crosses zero at time t3. The safe is from time t1 to time t3. After time t1, output current IE continues to increase higher that IT, but even at this higher current, voltage VCE drops significantly below voltage VCEX because of the clamping action of clamp 110 that has increased effectiveness due to the reduced current provided by current source 310 which has replaced current source 312 in response to the detection that VCE had reached VCEX. After current IE has reached its maximum value, it begins decreasing, first below current IT at time t2 then becomes zero at time t3 and has sign change from plus (+) to minus (−). At time t3, the current stops passing through IGBT 104 and begins passing through diode 112 in the opposite direction. Time t3 may thus be called the time of zero crossing and also the time where the current through IGBT 104 reaches zero.

The zero crossing at time t3 is detected by second TOMD 204 which is coupled to the outputs of current sources 310 and 312 which in turn are coupled to the emitter of IGBT 104. Second TOMD 204 is also coupled to voltage Vc through diode 322. Diode 322 is a high voltage type in order to protect second TOMD 204. When voltage VCE is sufficiently low, diode 322 is forward biased and conducting current. Using the power supply voltage of second TOMD 204, commonly referenced as VDD, second TOMD 204 can detect when current IE has reversed. For example, using a VDD over VC as a voltage for dsat, the point at which IGBT 104 has become saturated can be detected. The output of inverter 304, which is a logic high at voltage VDD when the safe and efficient modes are selectable, can be used by second TOMD 204. When current IE changes direction, second TOMD 204 can detect it.

Second TOMD 204 responds to the zero crossing at time t3 by providing a logic high to input S. Flip-flop 302 responds to the logic high on input S by providing a logic high on output Q. The logic high on output Q causes AND gates 306 and 308 to flip logic states so that AND gate 306, which has the inverting input, provides a logic low and AND gate 308 provides a logic high. This causes current source 312 to begin supplying current. The result is that IGBT 104 is then able to be in the efficient mode, which it is now safe to do, because the current through IGBT 104 has reached zero. The power can begin increasing again with the safeguard in place of being able to again switch to the lower current source 310 in response to first TOMD 202 detecting a risk of excessive power by switching input R to a logic high. This begins the cycle of entering the safe mode in which IGBT 104 avoids the excessive power problem, the current eventually reducing to zero, and then reinstituting the lower current source which brings back the efficient mode.

Thus it is seen that an IGBT can be used for its maximum potential in a first mode and protected in a second mode in which a power limitation feature is activated when the power is at risk of being excessive and the power limitation feature can be deactivated when the risk is removed. When current source 312 is enabled, a fast turn off capability of IGBT 104 is provided by pulling a high gate current so as to achieve a high rate of change of VCE (dVCE/dt) which can be dangerous, but it is safe because in the event of a VCE overvoltage, the high current can be replaced with a lower current that will ultimately lead to a zero crossing of current IE.

By now it is apparent that there has been described a transistor circuit having a transistor having a control electrode, a first current electrode, and a second current electrode. The transistor circuit further includes a turn off mode change circuit that has a signal input that receives a series of pulses, an output coupled to the control electrode of the transistor, and a control input, wherein the turn off mode change circuit has a fast turn off mode and a slow turn off mode. The transistor circuit further includes a turn off mode detection circuit coupled between the first current electrode and the second current electrode that detects when a transition from the fast turn off mode to the slow turn off mode is desired and when a transition from the slow turn off mode to the fast turn off mode may be performed. The transistor circuit may have a further characterization by which the turn off mode change circuit responds to the turn off mode detection circuit by switching to the slow turn off mode when the turn off mode detection circuit detects that the transition from the fast turn off mode to the slow turn off mode is desired. The transistor circuit may have a further characterization by which the transition from the fast turn off mode to the slow turn off mode is desired to avoid a breakdown of the transistor due to excessive voltage between the first current electrode and the second current electrode. The transistor circuit may have a further characterization by which the turn off mode change circuit responds to the turn off mode detection circuit by switching to the fast turn off mode when the turn off mode detection circuit detects that the transition from the slow turn off mode to the fast turn off mode will not cause the breakdown of the transistor due to excessive voltage between the first current electrode and then second current electrode. The transistor circuit may have a further characterization by which the turn off mode detection circuit comprises a comparator. The transistor circuit may have a further characterization by which the comparator compares a voltage on the first current electrode with a reference to detect if the transition from the fast turn off mode to the slow turn off mode is desired. The transistor circuit may have a further characterization by which the turn off mode detection circuit comprises a zero crossing detector. The transistor circuit may have a further characterization by which the zero crossing detector detects if current has stopped passing between the first and second current electrodes of the transistor. The transistor circuit may have a further characterization by which the turn off mode detection circuit includes a first turn off mode detection circuit having an output, a second turn off mode detection circuit having an output, and a flip-flop having a first input coupled to the output of the first turn off mode detection circuit, a second input coupled to the output of the second turn off mode detection circuit, and an output coupled to the turn off mode change circuit. The transistor circuit may have a further characterization by which the turn off mode change circuit includes a logic circuit having an input coupled to the flip-flop, a first output, and a second output, a low current path having an input coupled to the first output of the logic circuit and an output coupled between the control electrode and the second current electrode, and a high current path having an input coupled to the second output of the logic circuit and an output coupled between the control electrode and the second current electrode. The transistor circuit may have a further characterization by which the low current path is enabled by the flip-flop during a time after the first turn off mode detection circuit has determined that the low current path is desired and prior to the second turn off mode detection circuit determining that the high current path may be used. The transistor circuit may further include a load coupled between a power supply terminal and the control electrode of the transistor. The transistor circuit may have a further characterization by which the series of pulses is a series of pulse width modulation pulses, the transistor is an insulated gate field effect transistor, the control electrode is a gate, the first current electrode is a collector, and the second current electrode is an emitter.

Also disclosed is a method of driving a transistor using a series of pulses having a turn off mode in which current is drawn from a control electrode of the transistor. The method includes drawing current from the control electrode at a fast rate during a fast turn off mode. The method further includes detecting that a transition from the fast turn off mode to a slow turn off mode is desired. The method further includes drawing current from the control electrode at a slower rate in response to the detecting that a transition from the slow turn off mode to a fast turn off mode is desired. The method may further include detecting that a transition from the slow turn off mode to the fast turn off mode is allowed. The method may have a further characterization by which drawing current from the control electrode at the fast rate in response to the detecting that a transition from the slow turn off mode to the fast turn off mode is allowed. The method may have a further characterization by which the detecting that a transition from the slow turn off mode to the fast turn off mode is allowed uses zero crossing detection. The method may have a further characterization by which the detecting that a transition from the fast turn off mode to a slow turn off mode is desired uses a voltage comparison. The method may have a further characterization by which the series of pulses comprise pulse width modulation pulses and the transistor comprises an insulated gate bipolar transistor.

Disclosed also is an insulated gate bipolar transistor circuit responsive to pulse width modulation (PWM) pulses. The insulated gate bipolar transistor circuit includes an IGBT having a gate, a collector, and an emitter. The insulated gate bipolar transistor circuit further includes a load coupled between the collector and the gate of the IGBT. The insulated gate bipolar transistor circuit further includes a turn off mode change circuit that has a signal input that receives the PWM pulses, an output coupled to the gate of the IGBT, and a control input, wherein the driver circuit has a fast turn off mode and a slow turn off mode. The insulated gate bipolar transistor circuit further includes a turn off mode detection circuit coupled between the emitter and the collector and to the control input that communicates to the turn off mode change circuit when a transition from the fast turn off mode to the slow turn off mode is desired and when a transition from the slow turn off mode to the fast turn off mode may be performed. The insulated gate bipolar transistor circuit may have a further characterization by which the turn off mode change circuit has a first portion that uses a comparison between a voltage across the collector and the emitter and a reference to determine if the transition from the fast turn off mode to the slow turn off mode is desired and uses detection of a current direction change to determine if the transition from the slow turn off mode to the fast turn off mode may be performed.

Although the invention is described herein with reference to specific embodiments, various modifications and changes can be made without departing from the scope of the present invention as set forth in the claims below. For example, an RS flip-flop was described but other functional logic may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A transistor circuit, comprising:
   a transistor having a control electrode, a first current electrode, and a second current electrode;
   a turn off mode change circuit that has a signal input that receives a series of pulses, an output coupled to the control electrode of the transistor, and a control input, wherein the turn off mode change circuit has a first turn off mode and a second turn off mode, the turn off mode change circuit comprises:
   a logic circuit having a first output, and a second output,
   a low current path having an input coupled to the first output of the logic circuit and an output coupled between the control electrode and the second current electrode, and
   a high current path having an input coupled to the second output of the logic circuit and an output coupled between the control electrode and the second current electrode; and
   a turn off mode detection circuit coupled between the first current electrode and the second current electrode that detects when a transition from the first turn off mode to the second turn off mode is desired and when a transition from the second turn off mode to the first turn off mode may be performed.

2. The transistor circuit of claim 1, wherein the turn off mode change circuit responds to the turn off mode detection circuit by switching to the second turn off mode when the turn off mode detection circuit detects that the transition from the first turn off mode to the second turn off mode is desired.

3. The transistor circuit of claim 2, wherein the transition from the first turn off mode to the second turn off mode is desired to avoid a breakdown of the transistor due to excessive voltage between the first current electrode and the second current electrode.

4. The transistor circuit of claim 3, wherein the turn off mode change circuit responds to the turn off mode detection circuit by switching to the first turn off mode when the turn off mode detection circuit detects that the transition from the second turn off mode to the first turn off mode will not cause the breakdown of the transistor due to excessive voltage between the first current electrode and then second current electrode.

5. The transistor circuit of claim 1, wherein the turn off mode detection circuit comprises a comparator.

6. The transistor circuit of claim 5, wherein the comparator compares a voltage on the first current electrode with a reference to detect if the transition from the first turn off mode to the second turn off mode is desired.

7. The transistor circuit of claim 1, wherein the turn off mode detection circuit comprises a zero crossing detector.

8. The transistor circuit of claim 7, wherein the zero crossing detector detects if current has stopped passing between the first and second current electrodes of the transistor.

9. The transistor circuit of claim 8, wherein the turn off mode detection circuit comprises:
   a first turn off mode detection circuit having an output;
   a second turn off mode detection circuit having an output; and
   a flip-flop having a first input coupled to the output of the first turn off mode detection circuit, a second input coupled to the output of the second turn off mode detection circuit, and an output coupled to the turn off mode change circuit.

10. The transistor circuit of claim 9, wherein the low current path is enabled by the flip-flop during a time after the first turn off mode detection circuit has determined that the low current path is desired and prior to the second turn off mode detection circuit determining that the high current path may be used.

11. The transistor circuit of claim 1, further comprising a load coupled between a power supply terminal and the control electrode of the transistor.

12. The transistor circuit of claim 1, wherein the series of pulses is a series of pulse width modulation pulses, the transistor is an insulated gate field effect transistor, the control electrode is a gate, the first current electrode is a collector, and the second current electrode is an emitter.

13. A method of driving a transistor using a series of pulses having a turn off mode in which current is drawn from a control electrode of the transistor, comprising:
   drawing current from the control electrode at a fast rate through a high current path coupled between the control electrode and a current electrode of the transistor during a first turn off mode;
   detecting that a transition from the first turn off mode to a second turn off mode is desired; and
   drawing current from the control electrode at a slower rate through a low current path coupled between the control electrode and the current electrode of the transistor in response to the detecting that a transition from the second turn off mode to a first turn off mode is desired.

14. The method of claim 13, further comprising:
   detecting that a transition from the second turn off mode to the first turn off mode is allowed; and
   drawing current from the control electrode at the fast rate in response to the detecting that a transition from the second turn off mode to the first turn off mode is allowed.

15. The method of claim 14, wherein the detecting that a transition from the second turn off mode to the first turn off mode is allowed uses zero crossing detection.

16. The method of claim 15, wherein the detecting that a transition from the first turn off mode to a second turn off mode is desired uses a voltage comparison.

17. The method of claim 16, wherein the series of pulses comprise pulse width modulation pulses and the transistor comprises an insulated gate bipolar transistor.

18. An insulated gate bipolar transistor circuit responsive to pulse width modulation (PWM) pulses, comprising:
   an IGBT having a gate, a collector, and an emitter;
   a load coupled between the collector and the gate of the IGBT;
   a turn off mode change circuit that has a signal input that receives the PWM pulses, an output coupled to the gate of the IGBT, and a control input, wherein the turn off mode change circuit has a first turn off mode and a second turn off mode, the turn off mode change circuit comprises:
      a logic circuit having a first output, and a second output,
      a low current path having an input coupled to the first output of the logic circuit and an output coupled between the gate and the emitter, and
      a high current path having an input coupled to the second output of the logic circuit and an output coupled between the gate and the emitter; and
   a turn off mode detection circuit coupled between the emitter and the collector and to the control input that communicates to the turn off mode change circuit when a transition from the first turn off mode to the second turn off mode is desired and when a transition from the second turn off mode to the first turn off mode may be performed.

19. The insulated gate bipolar transistor circuit of claim 18, wherein:
   the turn off mode change circuit has a first portion that uses a comparison between a voltage across the collector and the emitter and a reference to determine if the transition from the first turn off mode to the second turn off mode is desired and uses detection of a current direction change to determine if the transition from the second turn off mode to the first turn off mode may be performed.

* * * * *